United States Patent [19]

Ezaki

[11] Patent Number: 4,991,284
[45] Date of Patent: Feb. 12, 1991

[54] METHOD FOR MANUFACTURING THICK FILM CIRCUIT BOARD DEVICE

[75] Inventor: Shiro Ezaki, Yokohama, Japan

[73] Assignee: Kabushiki Kaisha Toshiba, Kawasaki, Japan

[21] Appl. No.: 319,903

[22] Filed: Mar. 6, 1989

Related U.S. Application Data

[63] Continuation of Ser. No. 127,169, Dec. 1, 1987, abandoned.

[30] Foreign Application Priority Data

Dec. 3, 1986 [JP] Japan .................. 61-288102

[51] Int. Cl.⁵ .............................................. H01L 17/06
[52] U.S. Cl. .................................. 29/620; 29/829; 29/832; 29/840; 29/846; 427/8; 118/713; 73/865.9
[58] Field of Search .......... 29/610 R, 620, 829, 29/832, 840, 846; 427/8; 118/713; 73/865.8, 865.9

[56] References Cited

U.S. PATENT DOCUMENTS

| 4,724,040 | 2/1988 | Iwasa | 29/620 X |
| 4,735,676 | 4/1988 | Iwasa | 29/620 X |
| 4,830,878 | 5/1989 | Kaneko et al. | 427/58 |
| 4,835,038 | 5/1989 | Kaneko et al. | 156/89 |

FOREIGN PATENT DOCUMENTS

3241227C1 3/1984 Fed. Rep. of Germany .
3621667A1 1/1987 Fed. Rep. of Germany .

*Primary Examiner*—P. W. Echols
*Attorney, Agent, or Firm*—Oblon, Spivak, McClelland, Maier & Neustadt

[57] ABSTRACT

A method of manufacturing and monitoring the manufacture of a thick film circuit board device. The method includes the steps of forming a resistive layer in a prescribed pattern on an insulative base board, forming a first conductive layer on the insulative base board adjacent to the resistive layer with a gap of predetermined width therebetween and forming a second conductive layer in the gap and overlapping a portion of the resistive layer and the first conductive layer for establishing electrical contact between the resistive layer and the first conductive layer.

11 Claims, 3 Drawing Sheets

METHOD FOR MANUFACTURING THICK FILM CIRCUIT BOARD DEVICE

This application is a continuation of application Ser. No. 127,169, filed on Dec. 1, 1987, now abandoned.

FIELD OF THE INVENTION

The present invention relates generally to a thick film circuit board device, and more particularly, to a method for manufacturing a thick film circuit board device.

BACKGROUND OF THE INVENTION

Recently, thick film circuit board devices have been used in electronic appliances for constructing hybrid integrated circuits. In the hybrid integrated circuit, the thick film circuit board device has film resistors and film conductive wirings, both formed on the surface of an insulative base board by printing, e.g., screen printing. The film resistor is formed of a resistive material printed on the base board. The film conductive wiring is formed of a conductive material printed on the base board. Prescribed circuit elements such as capacitors, transistors or the like are mounted on the base board and are coupled to the film conductive wirings. The film conductive wirings electrically connect the film resistors and/or the circuit elements with each other. Thus, a hybrid integrated circuit results.

The thick film circuit board device has been widely accepted in order to reduce the weight and size of electronic appliances.

Referring now to FIG. 1, a conventional method for manufacturing such a thick film circuit board device will be described. The conventional method comprises the steps of preparing an insulative base board 10 made of ceramic, such as alumina ($Al_2O_3$), and providing a resistive layer 12 and a conductive layer 14 on base board 10. Resistive layer 12 and conductive layer 14 are formed by screen printing of a resistive paste and a conductive paste on base board 10, respectively. The resistive paste may contain, for example, ruthenium oxide ($RuO_2$) powder and glass frit. The conductive paste may contain, for example, copper (Cu) powder or silver-palladium (Ag/Pd) powder.

First, the resistive paste is screen printed on base board 10, dried and set at a temperature of about 800-900° C. in an atmosphere of air or oxide gas, so that resistive material layer 12, i.e., the film resistor is formed. Then the conductive paste is screen printed on base board 10, dried and set at a temperature of about 500-700° C., so that a set of conductive layers 14, i.e., the conductive wires are formed. The setting of the conductive paste is carried out in an atmosphere of inactive or resolutive gas, such as nitrogen gas.

A prescribed pair of conductive layers 14 to be coupled with resistive layer 12 are overlapped with their ends overlapping on the ends of resistive layer 12. The resistance of resistive layer 12 is then adjusted by trimming the layer with YAG laser beam or by sandblasting.

An insulative film made of silicon resin is screen printed o resistive layer 12 and/or conductive layer 14, and then hardened at a temperature of about 100-120° C., so that a solder resist film 16 is formed. Solder resist film 16 covers the thick film circuit board device, except portions to be connected to a circuit element 18. Circuit element 18 is coupled to prescribed conductive layers 14 by soldering with solder 20.

The thick film circuit board device can be provided with lead pins (not shown) for connection with foreign circuits. Also, the thick film circuit board device and circuit element 18 mounted thereon can be covered with another insulating film (not shown) made of resin for protecting &he entire surface of the circuit board device and circuit element 18.

However, the above-mentioned conventional method for manufacturing such a thick film circuit board device has a drawback, as described below. Conductive layer 14 is formed on base board 10 by screen printing after the formation of resistive layer 12 The screen printings of resistive layer 12 and conductive layer 14 are carried out using screen printing plates. On screen printing plate for printing conductive layer 14, the gap between the prescribed pair of conductive layers 14 to be coupled to resistive layer 12 is shorter than the length of resistive layer 12. Thus, respective ends of prescribed conductive layers 14 are coupled to the ends of resistive layer 12.

When a shear or shift occurs between the base board and screen printing plate during either of the printings for resistive layer 12 and conductive layer 14, the overlap joining conductive layer 14 to resistive layer 12 may occur, or the amount or range of the overlap may become insufficient. In the case of a shear which results in an insufficient overlap, the problem is difficult to discover. This is because the portion of resistive layer 12 corresponding to the gap between conductive layers 14 may be displaced in response to the shear but the length of the portion does not vary.

Therefore, a thick film circuit board device manufactured by the conventional method is subject to inferior coupling between resistive layer 12 and conductive layer 14.

SUMMARY OF THE INVENTION

The present invention has been accomplished in view of the above-mentioned circumstances and is intended for improving the drawback of the conventional method.

Therefore, an object of the present invention is to provide a method of manufacturing a thick film circuit board device in which the alignment between the resistive layer and the conductive layer to be coupled to the resistive layer can be easily detected.

Another object of the present invention is to provide a method of manufacturing a thick film circuit board device in which a resistive layer and a conductive layer can be reliably coupled to each other according to a relatively simple coupling procedure.

In order to achieve the above object, a manufacturing method of thick film circuit board device according to one aspect of the present invention includes the steps of forming a resistive layer in a prescribed pattern on an insulative base board, forming a first conductive layer on the insulative base board adjacent to the resistive layer with a gap of predetermined width therebetween and forming a second conductive layer in the gap and overlapping a portion of the resistive layer and the first conductive layer for establishing electrical contact between the resistive layer and the first conductive layer.

Additional objects and advantages the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
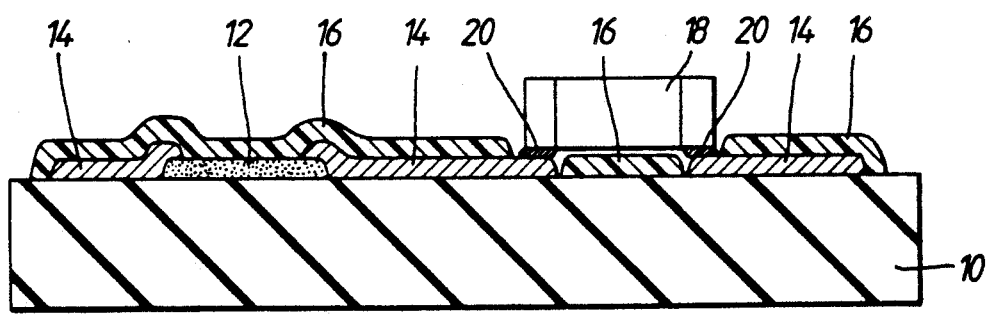
FIG. 1 is a sectional view of a thick film circuit board device manufactured according to a conventional method with an electric element mounted thereon for use as a hybrid integrated circuit.

The present invention will be described in detail with reference to FIGS. 2(A) through FIG. 5. Throughout the drawings, reference numerals or letters used in FIG. 1 (Prior Art) will be used to designate like or equivalent elements for simplicity of explanation.

Figure 2A:
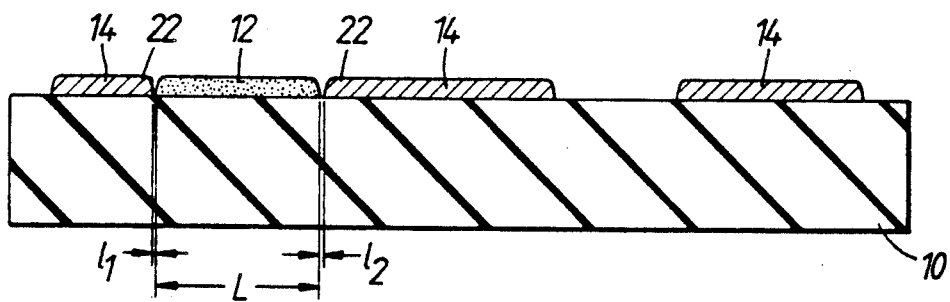
FIGS. 2(A), 2(B) and 2(C) are sections illustrating sequential steps of manufacturing a thick film circuit board device according to one embodiment of the present invention.
Figure 2B:
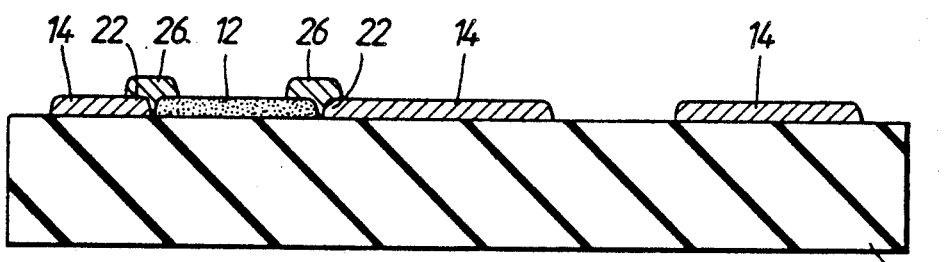
Figure 2C:
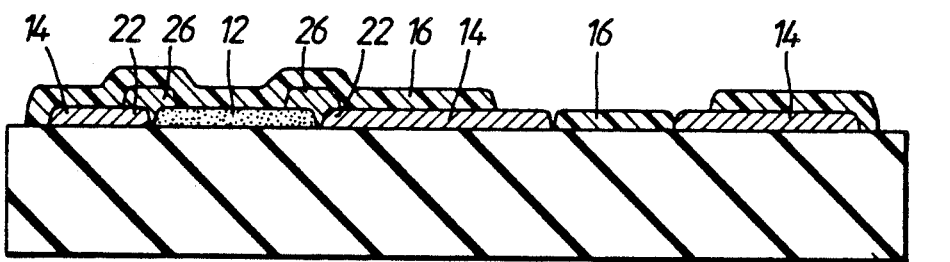

Referring now to FIGS. 2(A), 2(B) and 2(C), a first embodiment of the manufacturing method for a thick film circuit board device according to the present invention will be described in detail.

In FIG. 2(A), an insulative base board 10 made of ceramic, such as alumina ($Al_2O_3$), a resistive paste containing, for example, ruthenium oxide ($RuO_2$) powder and glass frit, and a conductive paste containing, for example, copper (Cu) powder are prepared.

First, the resistive paste is screen printed on base board 10, dried and set at a temperature of about 800–900° C. in an atmosphere of air or oxide gas. Thus, a resistive layer 12, i.e., the film resistor, is formed. Then, the conductive paste is screen printed on base board 10, dried and set at a temperature of about 500–700° C. also in the atmosphere of inactive or resolutive gas, such as nitrogen gas. Thus, first conductive layer 14, i.e., the conductive wiring, is formed. Screen printings of resistive layer 12 and first conductive layer 14 are carried out using screen printing plates (not shown).

Figure 3:
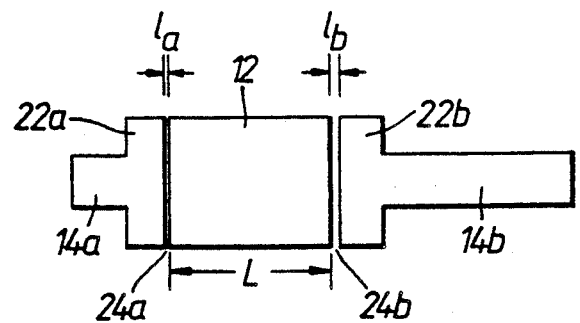
FIG. 3 is a plan view showing the resistive layer and the conductive layers to be coupled to the resistive layer of FIG. 2(A)

Resistive layer 12 is shaped as a rectangle with a length of L and a prescribed width, as shown in FIG. 3. First conductive layer 14 has an optional width. A prescribed pair of first conductive layers 14a and 14b to be coupled to resistive layer 12 are provided with land portions 22a and 22b adjacent to resistive layer 12, as shown in FIG. 3. The width of land portions 22a and 22b is unified to a prescribed amount equal to or greater than the width of resistive layer 12, when the width of prescribed first conductive layers 14a and 14b is different from the width of resistive layer 12. The length of both land portions 22a and 22b is the same prescribed amount, e.g., about 0.5 mm.

On screen printing plate for printing first conductive layer 14, the gap between land portions 22a and 22b is a prescribed amount larger than the length L of resistive layer 12 by, e.g., about 0.4 mm. As a result, land portions 22a and 22b of first conductive layers 14a and 14b are separated from resistive layer 12 by gaps 24a and 24b between resistive layer 12 and land portions 22a and 22b, respectively.

The conductive paste is again screen printed on base board 10 at positions corresponding to gaps 24a and 24b, as shown in FIG. 2(B). The conductive paste is dried and set at the temperature of about 500–700° C. also in the atmosphere of inactive or resolutive gas, such as nitrogen gas. Thus, second conductive layers 26a and 26b are formed. Screen printing of second conductive layers 26a and 26b is also carried out in using screen printing plate (not shown).

Figure 4:
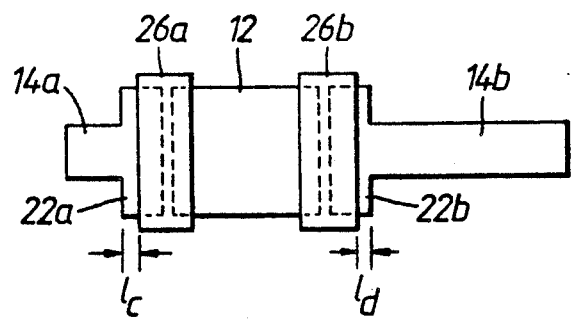
FIG. 4 is a plan view showing the resistive layer and the conductive layers coupled to the resistive layer through the coupling layers of FIG. 2(B)

Second conductive layers 26a and 26b connect resistive layer 12 to first conductive layers 14a and 14b through land portions 22a and 22b, respectively, as shown in FIG. 2(B) and FIG. 4.

The resistance of resistive layer 12 is then adjusted by trimming the layer with a YAG laser beam or by sandblasting.

Figure 2D:
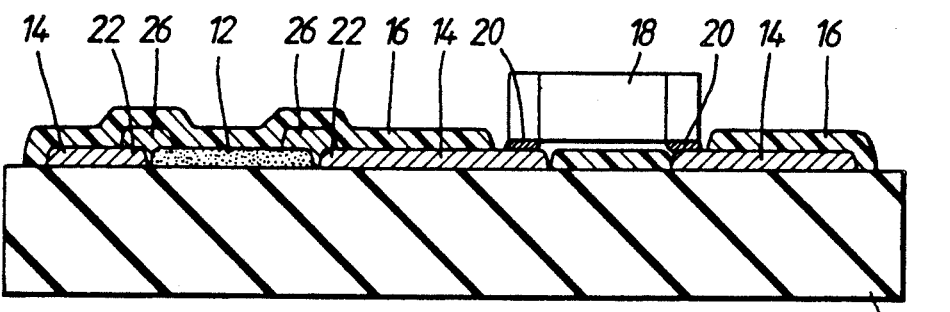
FIG. 2(D) is a section illustrating a hybrid integrated circuit board device constructed with the thick film circuit board device of FIGS. 2(A), 2(B) and 2(C) and having an electric element mounted thereon.

An insulative film made of silicon resin is screen printed and then hardened at a temperature of about 100–120° C. Thus, a solder resist film 16 is formed, as shown in FIG. 2(C). Solder resist film 16 covers the thick film circuit board device, except portions to be connected to a circuit element 18. Circuit element 18 is coupled to prescribed conductive layers 14 by soldering with solder 20. As a result, a hybrid integrated circuit, as shown in FIG. 2(D), is obtained.

According to this embodiment of the method of manufacturing the thick film circuit board device, land portions 22a and 22b of prescribed first conductive layers 14a and 14b to be coupled to resistive layer 12 are separated from resistive layer 12. In other words, land portions 22a and 22b are not overlapped to resistive layer 12. This is because the gap between land portions 22a and 22b is larger than the length L of resistive layer 12 by a prescribed amount, e.g., about 0.4 mm, as above-mentioned.

As a result, a shear between screen printing plates of resistive layer 12 and first conductive layer 14 is easily detected after the printing of the conductive paste for first conductive layer 14.

When the shear occurs between the printing plates so that the pattern of first conductive layer 14 shifts, e.g., rightward in the drawing of FIG. 3, the length la of gap 24a is shorter than the length lb of gap 24b. For example, the lengths la and lb are 0.1 mm and 0.3 mm, respectively, when the pattern of first conductive layer 14 shifts rightward by 0.1 mm. The difference between 0.1 mm and 0.3 mm is very apparent. Thus, the alignment can be easily detected.

The detection of the alignment can be made easier when the color of base board 10 is different from the color of resistive layer 12 and first conductive layer 14. For this purpose, the colors of base board 10 and resistive layer 12 could be made white and black, or any contrasting colors could be used. First conductive layer 14 normally presents, of course, the color of copper.

Misalignment may occur between second conductive layer 26 and resistive layer 12 or first conductive layer 14. However, this misalignment also can be easily detected.

When the shear between the printing plates occurs so that the pattern of second conductive layer 26 shifts, e.g., rightward in the drawing of FIG. 4, the length lc of land portion 22a appearing uncovered by second conductive layer 26a becomes larger than the length ld of land portion 22b appearing uncovered by second conductive layer 26b. For example, the length of land portions 22a, 22b, gaps 24a, 24b and the length of second conductive layer 26a, 26b may be 0.5 mm, 0.2 mm and 0.8 mm, respectively, in the above embodiment. When the pattern of second conductive layer 26 shifts rightward by 0.1 mm from its standard position, the lengths lc and ld are 0.3 mm and 0.1 mm, respectively. The difference between 0.3 mm and 0.1 mm is very apparent. Thus, the alignment of second conductive layer 26 can be easily detected.

First and second conductive layers 14 and 26 are made of the same conductive paste. Thus, both have the same color, e.g., the color of copper. However, the width of second conductive layers 26a, 26b is made larger than the width of land portions 22a, 22b. Therefore, if land portions 22a, 22b appear uncovered by second conductive layers 26a, 26b, this can be easily detected. As a result, the alignment of second conductive layer 26 also can be detected.

Figure 5:
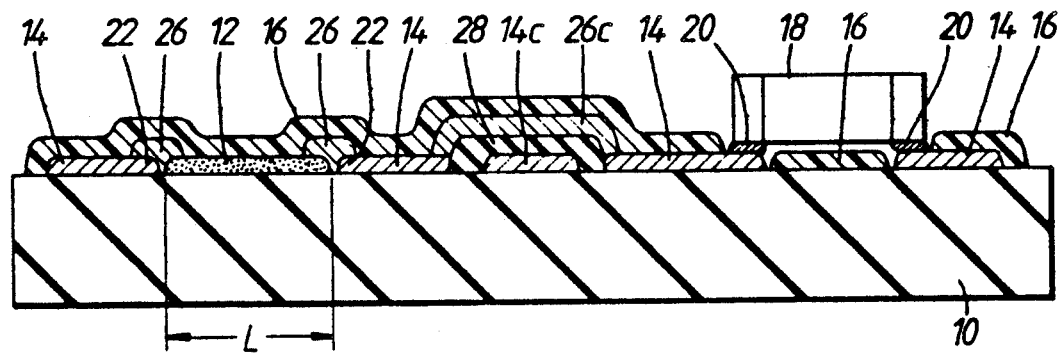
FIG. 5 a section of a thick film circuit board device manufactured according to another embodiment of the present invention with an electric element mounted thereon for use as a hybrid integrated circuit.

Referring now to FIG. 5, another embodiment of the method according to the present invention for manufacturing the thick film circuit board device will be described.

In FIG. 5, an insulative base board 10 made of ceramic, such as alumina ($Al_2O_3$), a resistive paste containing, for example, ruthenium oxide ($RuO_2$) powder and glass frit, a conductive paste containing, for example, copper (Cu) powder, and an insulative paste containing, for example, glass powder are prepared.

First, the resistive paste is screen printed on base board 10, dried and set at the temperature of about 800–900° C. in the atmosphere of air or oxide gas. Thus, a resistive layer 12. i.e.. the film resistor is formed. Then, the conductive paste is screen printed on base board 10 dried and set at the temperature of about 500–700° C. also in the atmosphere of inactive or resolutive gas, such as nitrogen gas. Thus, first conductive layer 14, i.e., the conductive wiring is formed Prescribed first conductive layers 14 to be coupled to resistive layer 12 are also provided with land portions 22a, 22b, as shown in FIG. 3. The gap between land portions 22a, 22b is made larger than the length L of resistive layer 12 by about 0.4 mm.

Then, the insulative glass paste is screen printed on base board 10 so as to cover a prescribed conductive layer 14c. The insulative glass paste is dried and set at the temperature of about 500–700° C. in the atmosphere of inactive or resolutive gas, such as nitrogen gas. Thus, an insulative layer 28 is formed.

Then, the conductive paste is again screen printed on base board 10 at positions corresponding to gaps 24a, 24b and insulative layer 28. The conductive paste is dried and set at the temperature of about 500–700° C. also in the atmosphere of inactive or resolutive gas, such as nitrogen gas. Thus, second conductive layers 26a, 26b and 26c are formed.

Second conductive layers 26a and 26b connect resistive layer 12 to land portions 22a and 22b of prescribed first conductive layers 14a and 14b, respectively, as shown in FIG. 4. Second conductive layer 26c connects first conductive layers 14 separated from prescribed first conductive layer 14c. Second conductive layer 26c is insulated from prescribed first conductive layer 14c by insulative layer 28. Therefore, second layer 26c operates as a jumper wiring in reference to prescribed first conductive layer 14c.

The resistance of resistive layer 12 is then adjusted by trimming the layer with a YAG laser beam or by sandblasting.

An insulative film made of silicon resin is screen printed and then hardened at a temperature of about 100–120° C. Thus, a solder resist film resist film 16 is formed. Solder resist film 16 covers the thick film circuit board device except portions to be connected to a circuit element 18. Circuit element 18 is coupled to prescribed conductive layers 14 by soldering with solder 20. As a result, a hybrid integrated circuit is obtained.

In the thick film circuit board device, as shown in FIG. 1, manufactured by the conventional method, resistive layer 12 is directly coupled to conductive layer 14. On the other hand, in the thick film circuit board device manufactured by the method according to the present invention, resistive layer 12 is coupled to first conductive layer 14 through second conductive layer 26. Therefore, the manufacturing method according to the present invention requires an extra process as compared to the conventional method. However, the thick film circuit board device often requires the jumper wiring.

In the second embodiment, as shown in FIG. 5, second conductive layers 26a, 26b for coupling to resistive layer 12 are made simultaneously with the jumper wiring of second conductive layer 26c. Therefore, the manufacturing method according to the present invention does not cause a particular disadvantage in the case where a jumper wiring is formed on the thick film circuit board device.

In the embodiments, the gap between prescribed first conductive layers 14a and 14b is made larger than the length L of resistive layer 12 by a prescribed amount, e.g., 0.4 mm. However, the gap can be made the same as the length L of resistive layer 12. When a shear occurs between first conductive layer 14 and resistive layer 12 in this case, a gap arises between resistive layer 12 and one of land portions 22a, 22b. The other of land portions 22a, 22b overlaps on resistive layer 12. Thus, the alignment can be easily detected.

As described above, the present invention can provide an extremely preferable method for manufacturing a thick film circuit board device.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. A method for manufacturing a thick film circuit board device and monitoring the manufacture thereof, comprising the steps of:
   forming a resistive layer in a prescribed pattern on an insulative base board;
   forming a first conductive layer on the insulative base board adjacent to the resistive layer with a gap of predetermined width therebetween;
   forming a second conductive layer in the gap and overlapping a portion of the resistive layer and the first conductive layer for establishing electrical contact between the resistive layer and the first conductive layer;
   determining the alignment between said resistive layer and said first conductive layer by comparing the relative position of said resistive layer to adjacent portions of said first conductive layer;
   determining the alignment between said first conductive layer and said second conductive layer by comparing the overlap of adjacent land portions of said first conductive layer and said second conductive layer;
   wherein the alignment between said resistive layer and said first conductive layer is determined by comparing a gap between an edge of said resistive layer and a first adjacent land portion of said first conductive layer with a gap between the opposite edge of said resistive layer and a second adjacent land portion of said first conductive layer, and
   wherein the alignment between said first conductive layer and said second conductive layer is determined by comparing a length between an exposed edge of said first land portion of said first conductive layer and an adjacent parallel edge of a first portion of said second conductive layer overlapping both an end of a portion of said resistive layer and said first land portion, with a length between an exposed edge of said second land portion of said first conductive layer and an adjacent parallel edge of a second portion of said second conductive layer overlapping both the opposite end of said portion of said resistive layer and said second land portion.

2. The method of claim 1 wherein the step of forming the first conductive layer includes the step of forming a separated portion of the first conductive layer with a space between the separated portion and at least part of the remaining portion of the first conductive layer, and the method also includes the step of forming an insulative layer in the space and on the separated portion for electrically insulating the separated portion from the part of the remaining portion, after the step of forming the first conductive layer.

3. The method of claim 2 also including the step of forming a jumper conductive layer on the insulative layer after the step of forming the insulative layer.

4. The method of claim 1 wherein the step of forming the resistive layer includes the step of depositing a resistive paste on the insulative base board, drying the paste and heating the base board to a temperature between about 800° C. and 900° C.

5. The method of claim 4 wherein the step of depositing the resistive paste includes the step of combining ruthenium oxide powder with glass frit to form the resistive paste.

6. The method of claim 1 wherein the steps of forming the resistive layer, forming the first conductive layer and forming the second conductive layer each layer includes a step of screen printing the respective layer.

7. The method of claim 1 also including the step of trimming the resistive layer.

8. The method of claim 7 wherein the step of trimming includes the step of applying a YAG laser beam to the resistive layer.

9. The method of claim 7 wherein the step of trimming includes the step of sandblasting the resistive layer.

10. The method of claim 1 also including the step of mounting integrated circuit elements to the first conductive layer.

11. The method of claim 1, further comprising:
    said step of forming said first conductive layer comprising forming said first conductive layer in the form of at least two isolated portions adjacent to said resistive layer;
    said step of forming said second conductive layer comprising forming said second conductive layer in the form of two isolated portions each overlapping a respective portion of the resistive layer and the respective portion of the first conductive layer adjacent thereto for establishing electrical contact between the portions of the resistive layer and the respective portions of the first conductive layer adjacent thereto; and
    trimming the resistive layer between the portions of said second conductive layer contacting said resistive layer until said resistive layer has a predetermined resistance.

* * * * *